US006468879B1

(12) United States Patent
Lamure et al.

(10) Patent No.: US 6,468,879 B1
(45) Date of Patent: Oct. 22, 2002

(54) METHOD AND DEVICE FOR SEPARATING A PLATE OF MATERIAL, IN PARTICULAR SEMICONDUCTOR MATERIAL, INTO TWO WAFERS

(75) Inventors: Jean-Michel Lamure, Saint-Jean-le-Vieux; François Lissalde, Seyssins, both of (FR)

(73) Assignee: S.O.I. TEC Silicon on Insulator Technologies, Bernin (FR)

( * ) Notice: Subject to any disclaimer, the term of this patent is extended or adjusted under 35 U.S.C. 154(b) by 0 days.

(21) Appl. No.: 09/807,971

(22) PCT Filed: Oct. 29, 1999

(86) PCT No.: PCT/FR99/02658

§ 371 (c)(1),
(2), (4) Date: Aug. 13, 2001

(87) PCT Pub. No.: WO00/26000

PCT Pub. Date: May 11, 2000

(30) Foreign Application Priority Data

Oct. 30, 1998 (FR) ............................................ 98 13660

(51) Int. Cl.[7] .......................... H01L 21/30; H01L 21/46

(52) U.S. Cl. ....................... 438/458; 438/455; 438/459; 438/460; 438/977; 83/152; 83/451; 83/870

(58) Field of Search ................................ 438/455, 458, 438/459, 460, 977; 83/152, 451, 870

(56) References Cited

U.S. PATENT DOCUMENTS 3,651,385 A 3/1972 Kobayashi
4,184,472 A 1/1980 Benedicto et al.
5,580,112 A 12/1996 Lin et al.
6,140,209 A * 10/2000 Iwane et al. ................ 438/458

FOREIGN PATENT DOCUMENTS

| | | |
|---|---|---|
| DE | 233020 | 9/1910 |
| DE | 225569 | 3/1911 |
| DE | 883 875 | 7/1953 |
| GB | 2 124 547 | 2/1984 |

OTHER PUBLICATIONS

Bruel M. Et Al. "Smart–Cut: A new S.O.I. Material Technology Based on Hydrogen Implantation and Wafer Bonding" International Conference on Solid State Devices and Materials, vol. Conf. 1996, Jan. 1, 1996, pp. 458–460.

* cited by examiner

*Primary Examiner*—David L. Talbott
*Assistant Examiner*—David A. Zarneke
(74) *Attorney, Agent, or Firm*—Jacobson Holman PLLC

(57) ABSTRACT

The invention relates to a method of separating into two wafers (2,4) a plate (1) of material for manufacturing substrates for electronics, optics, or optoelectronics, or for manufacturing microsystems, said wafers being situated on either side of a plane of weakness (6), the method being characterized in that it comprises the steps consisting in:

Figure 1:
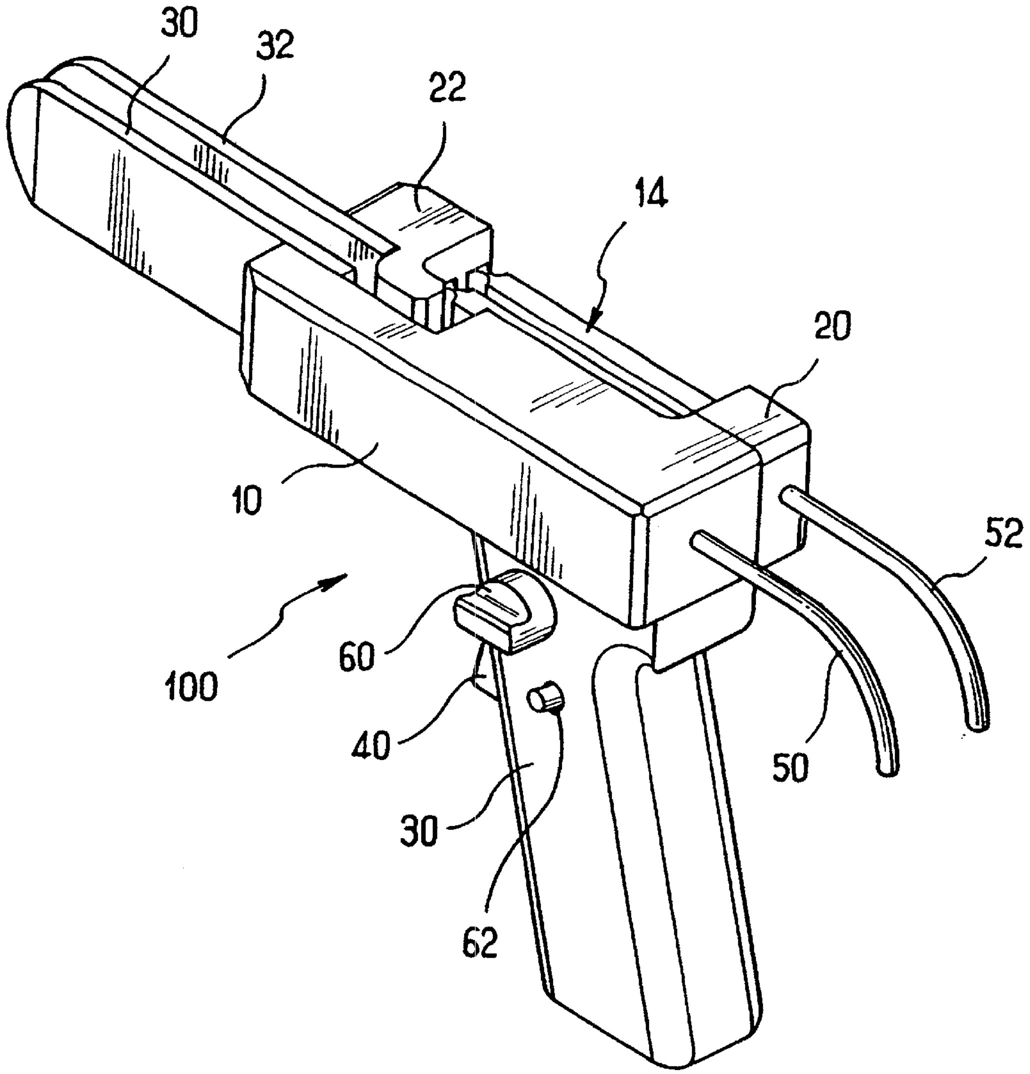

exerting a deformation force on at least one of the wafers so as to cause the wafers (2, 4) to separate from each other in a zone of the plate (1) at said plane of weakness; and exerting guided separation movement on the wafers (2, 4).

The invention also provides apparatus (100) for implementing the method, which apparatus has gripping members (30, 32) suitable for exerting said deformation force and for performing said separation.

22 Claims, 5 Drawing Sheets

FIG.2a
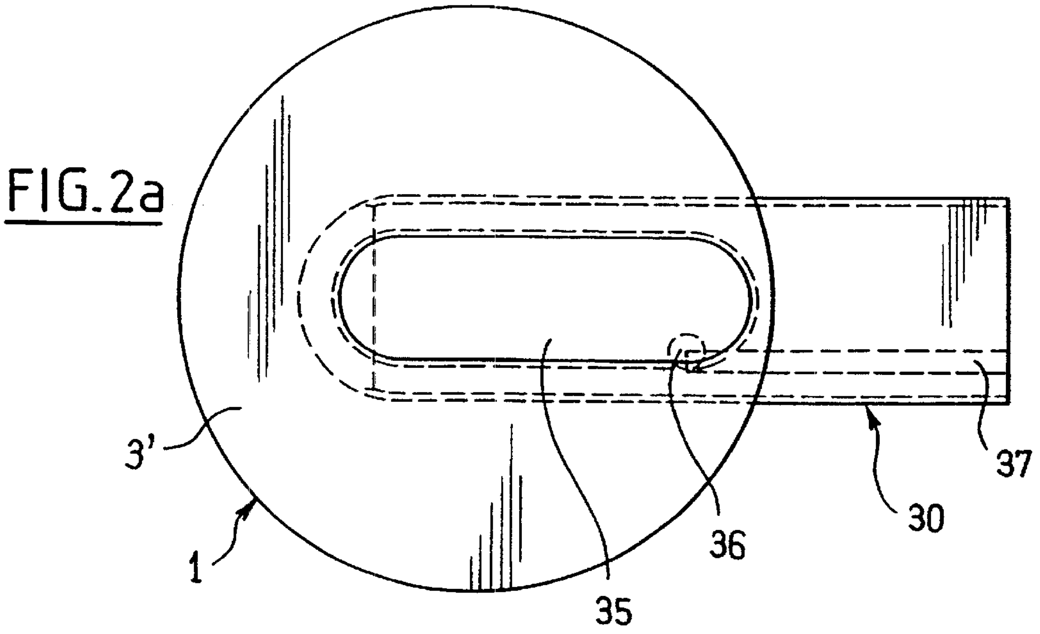
FIG.2b
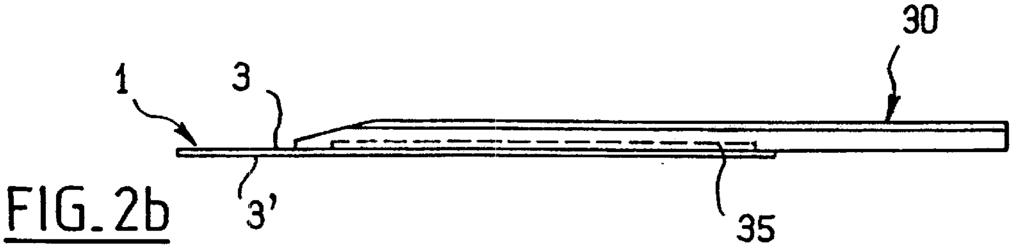
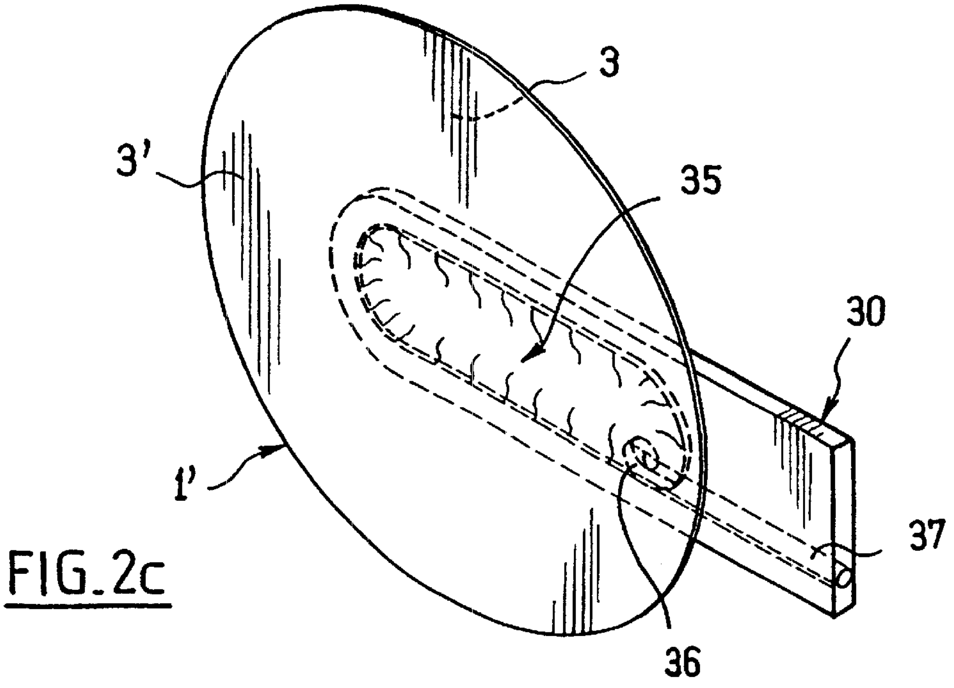
FIG.2c

METHOD AND DEVICE FOR SEPARATING A PLATE OF MATERIAL, IN PARTICULAR SEMICONDUCTOR MATERIAL, INTO TWO WAFERS

This application is a national phase under 35 USC §371 of PCT International Application No. PCT/FR99/02658 which has an International Filing Date of Oct. 29, 1999, which designated the United States of America and was published in French and claims priority from 98-13550 filed Oct. 30, 1998, in France which is claimed herein.

The invention relates in general to the field of materials processing, and more particularly to processing materials for manufacturing substrates for electronics, optics, or optoelectronics, or indeed for manufacturing Microsystems. In particular, the invention relates to a method and to apparatus for performing separation operations on planes of weakness in such substrates, and for doing so in a manner that is controlled and precise.

More specifically, the invention relates to a method and to apparatus for separating on a separation plane two wafers initially placed one against the other with varying degrees of mechanical cohesion.

A known method of manufacture, silicon on insulator (SOI), comprises a step of implanting ions to given depth in a monocrystalline silicon wafer, a step of fixing said wafer on a stiffener such as silicon that has optionally been oxidized on the surface, and then a step for ensuring that cleavage takes place at least in part on a plane of weakness as defined by the layer of implanted ions. (In some cases, if the thicknesses of the two portions of the monocrystalline silicon wafer situated on either side of the plane of weakness are sufficiently great so that they themselves present enough mechanical strength, the step of fixing on a stiffener can be omitted.)

In that type of method, whether cleavage takes place completely or occurs in part only, the two wafers remain stuck together in practice (merely by a suction cup effect even when cleavage is complete), and they still need to be separated so as to obtain firstly the final SOI substrate which will subsequently be subjected to various finishing treatments, and secondly the remaining monocrystalline silicon which can be recycled in the method.

Such separation must naturally be performed with the greatest care in order to ensure that the two wafers come apart, where necessary while also finishing off cleavage, without running the risk of damaging the two wafers.

In general, this operation is performed manually by a particularly skilled operator, for example by inserting a sharp blade or the like into the edge of the plate level with the plane of separation so that separation can be achieved by a wedging effect. This operation runs the risk of causing the facing faces of the two wafers to be subjected to shocks and to friction, thereby damaging them. In addition, this manual operation is lengthy and fiddly, and production throughputs are greatly constrained thereby. Finally, particularly when cleavage between the two wafers is to be terminated by the separation process itself, the forces applied to the plate need to be particularly great and the above-mentioned manual operation becomes inappropriate, or even dangerous.

The present invention thus seeks to provide a method and apparatus for enabling such separation to be performed quickly, reliably, and reproducibly, and which also avoids any contact or friction between the wafers while they are being separated, and thus any risk of scratching or of particles being deposited on the active faces of said wafers.

Another object of the invention is to be able to separate wafers which cohere mechanically to an extent that can vary very largely, in particular wafers between which macroscopic cleavage is partial only, and without it ever being necessary to exert excessive forces on the plate.

Thus, in a first aspect, the present invention provides a method of separating into two wafers a plate of material for manufacturing substrates for electronics, optics, or optoelectronics, or for manufacturing microsystems, said wafers being situated on either side of a plane of weakness, the method being characterized in that it comprises the steps consisting in:

- exerting a deformation force on at least one of the wafers so as to cause the wafers to separate from each other in a zone of the plate at said plane of weakness; and
- exerting guided separation movement on the wafers.

By means of the invention, by exerting a deforming force it is possible in a localized zone of the plate to initiate a separation wave in the plane of weakness. This wave can propagate over the entire extent of the plane of weakness either as soon as the deformation is applied thereto, or else once the separation movement of the two wafers has begun, but in any event extremely quickly and without any need to apply large separation forces.

If forces were to be exerted from opposite sides of the wafers over the entire area without having a localized start of separation, then it would be necessary to integrate the force required for achieving separation over the entire surface area, and that would amount to a considerable force.

However, in the method of the invention, the force to be applied to achieve separation proper is very limited, making it possible to achieve this separation on a path that is extremely well controlled, without any risk of shock or friction between the surfaces being separated, which is particularly important when the surfaces are to become active surfaces for which quality requirements in terms of purity, shape, etc. are particularly critical.

Advantageously, the separation start is achieved by exerting a main stress in the vicinity of an edge (or of the single edge when the plate is in the form of a disk), on at least one of the faces of the plate but not on the edge surface thereof, even though certain variants of the invention allow for the combination of stresses being applied both on the faces and on the edge surface.

Thus, in accordance with another object, the invention makes it possible to separate the wafers on a single plane of weakness that is well determined.

In the specification, the term "plane of weakness" means a zone of material obtained after the material has been subjected to special treatment, which zone extends over a certain thickness perpendicularly to said plane. Such a treatment can comprise implanting an atomic species, making the material porous, etc. In any event, the treatment is such as to enable the structure of the material in said zone to be modified or as to ensure that the material has a special structure in said zone so that separation by the method and/or the apparatus of the invention takes place preferentially in said zone. The plane need not be a plane of the crystal lattice in the strict meaning of that term, and separation can take place in and can extend perpendicularly to said plane so as to occupy a plurality of crystal lattice planes, depending on irregularities in the materials.

Preferred features of the method of the invention are as follows:

- the step of applying a deformation force comprises applying suction on at least one of the wafers in a region which extends locally close to the vicinity of an edge of the plate;
- the step of applying a deformation force comprises applying suction on at least one of the wafers in a region which extends from close to the vicinity of the edge of the plate to the center thereof; advantageously, under such circumstances, the suction is applied by gripping means of stiffness greater than that of the wafers to be separated;

advantageously, the deformation is produced by applying a force on a zone of the plate which is situated between at least two thrust points that are rigidly secured to each other; advantageously the amplitude of the deformation in the direction perpendicular to the main surfaces of the plate is less than 1 mm, and preferably less than 500 μm; this characteristic makes it possible to control and to limit deformation of the wafers and the faults that could result therefrom;

the step of applying a deformation force is advantageously suitable for giving rise to shear stress in at least one region of the plane of weakness; advantageously, this deformation is implemented by curving the plate in a direction perpendicular to its surface;

the separation step comprises moving means suitable for applying said suction in a direction that extends generally transversely to the plane of the plate;

a the separation step consists in moving at least one of the wafers in translation without rotation;

the separation step consists in moving at least one of the wafers in translation accompanied by rotation;

the method further includes a step of releasing at least one of the wafers by eliminating the suction;

the method further includes a step of applying stress suitable for favoring separation; and said application of stress is taken from the group comprising: applying a temperature gradient, applying mechanical vibration, applying chemical etching, applying shear stress, and applying a flow of fluid at high speed.

If the stress suitable for favoring separation is shear stress, it can be obtained by heat treatment when the materials on either side of the plane of weakness do not have the same coefficient of thermal expansion or when these materials are not at the same temperature. It can also be obtained by deforming the plate, e.g. by deformation tending to give the plate a convex shape around an elongate cap.

The stress suitable for favoring separation can correspond to a combination of the above-specified stresses, either simultaneously or separated in time.

The deformation force and the stress suitable for favoring separation can both be of the same kind and can correspond to a single operation.

In a second aspect, the invention provides apparatus for separating a plate of material, in particular of semiconductor material, into two wafers, said wafers being situated on either side of a plane of weakness, the apparatus being characterized in that it comprises:

means for holding the plate via a first wafer;

stress-applying means suitable for exerting plate deformation stress at least on the second wafer; and means for moving the wafers apart from each other along a predetermined path.

Preferred but non-limiting features of the apparatus of the invention are as follows:

the stress-applying means and the separation means are constituted by the same gripping member;

said gripping member possesses suction means;

the gripping member includes a generally plane element whose face directed towards said wafer possesses at least one suction cavity;

a single suction cavity is provided that is generally elongate in shape and that is suitable for extending between an edge region of the plate and a central region of the plate;

the holding means is constituted by a second gripping member extending substantially parallel to the first gripping member;

the device further includes guide means on which the first gripping member is mounted;

the device further includes means for resiliently urging the first gripping member away from the second gripping member;

the device further includes manual actuator means suitable for urging the first gripping member against said resilient urging so as to move the two gripping members towards each other;

the guide means and the resilient urging means are constituted by the same member;

said member is a single-piece link member constituting a deformable parallelogram; and it further includes means for selectively eliminating the suction.

Figure 3A:
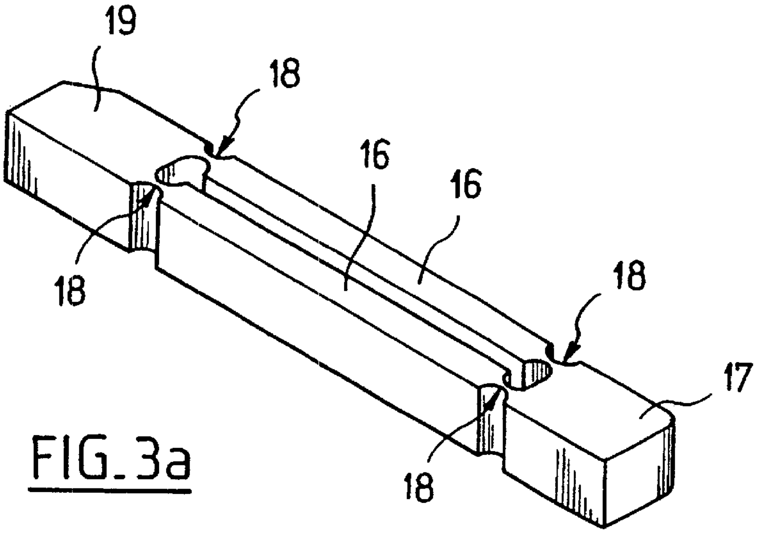
Figure 3B:
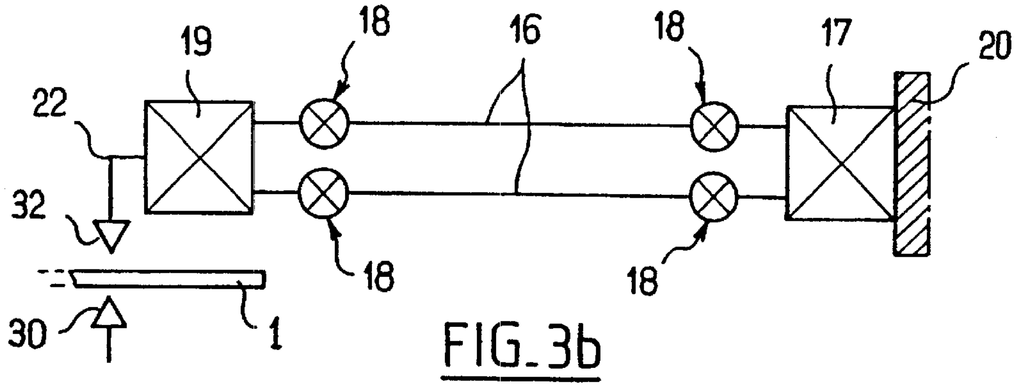
Figure 3C:
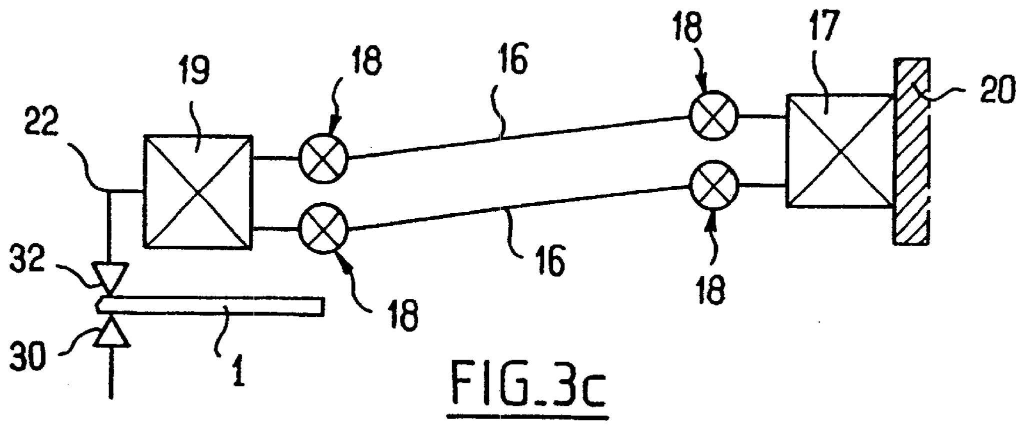
Figure 4A:
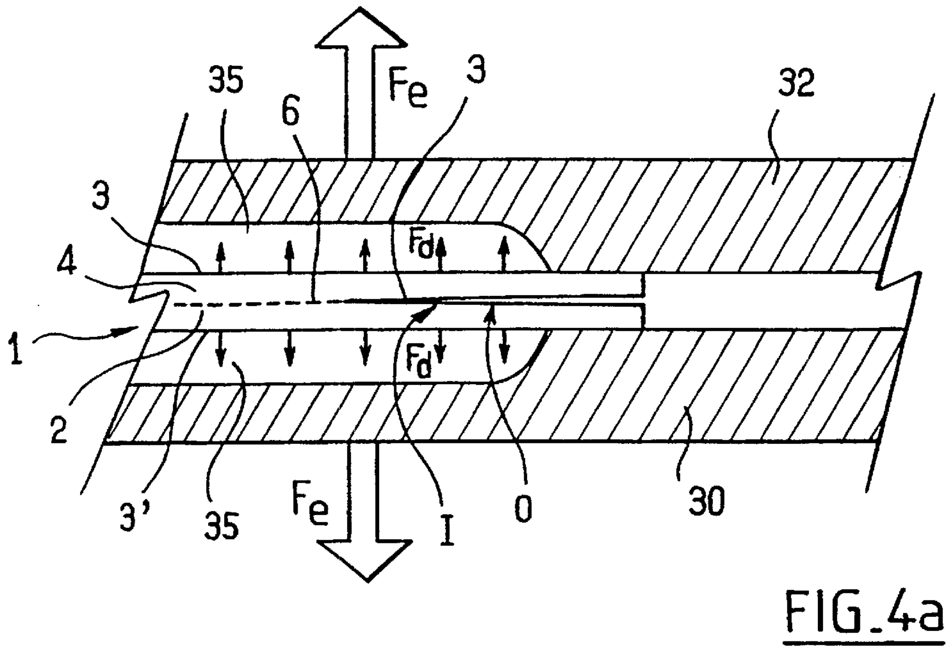
Figure 5:
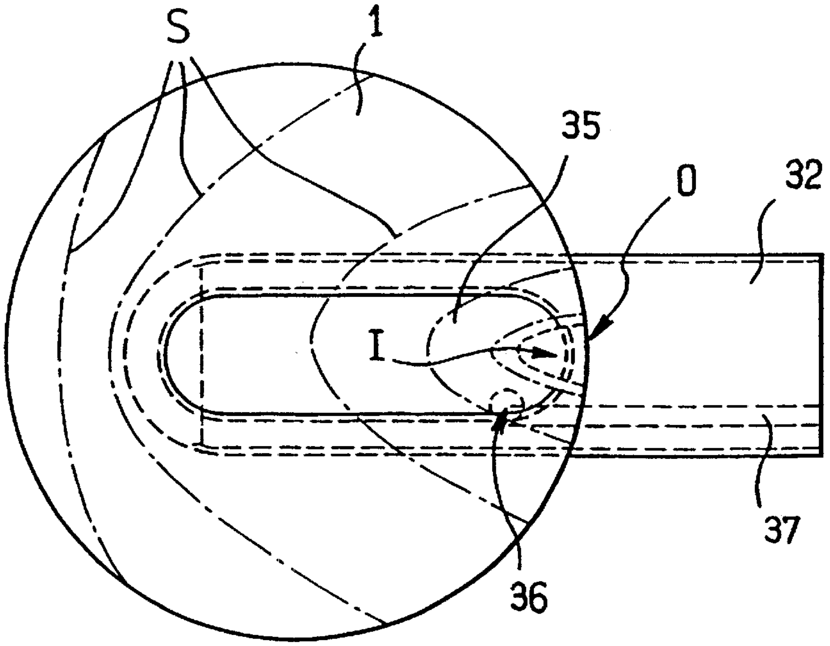
Figure 6:
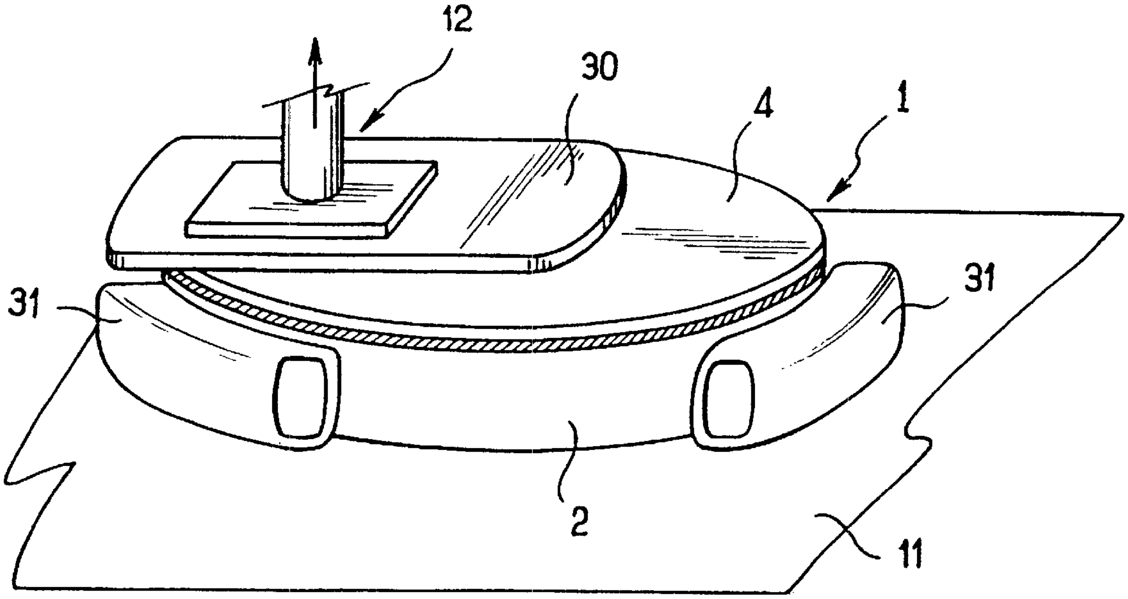
Figure 4B:
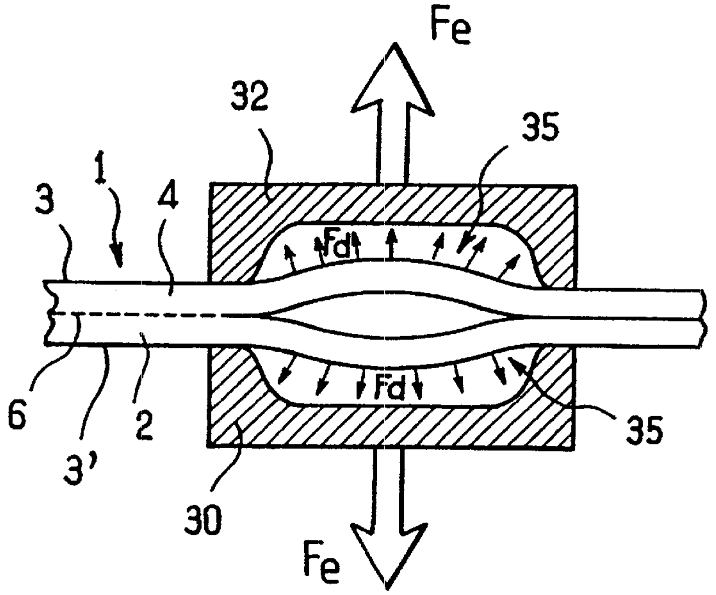

Other features, objects, and advantages of the invention and apparatus of the invention appear more clearly on reading the following detailed description given with reference to the accompanying drawings, in which:

FIG. 1 is a perspective view of a first embodiment of separation apparatus of the invention;

FIG. 2*a* is an overall elevation view of a gripping portion of the FIG. 1 apparatus and of a plate to be separated into two wafers;

FIG. 2*b* is a cross-section view through the assembly of FIG. 2*a*;

FIG. 2*c* is a perspective view of the assembly of FIGS. 2*a* and 2*b*;

FIG. 3*a* is a perspective view of a part forming a deformable parallelogram suitable for fitting to the apparatus of FIG. 1;

FIG. 3*b* is a diagrammatic representation of the deformable parallelogram in a first position;

FIG. 3*c* is a diagrammatic representation of the deformable parallelogram in a second position;

FIG. 4*a* is a fragmentary section view on a mid-longitudinal plane showing two gripping members situated on either side of a plate when initiating separation;

FIG. 4*b* is a fragmentary section view on a plane extending transversely to the gripping members, under the same circumstances;

FIG. 5 is a diagram showing how a separation wave propagates in the plate; and FIG. 6 is a diagrammatic perspective view of a second embodiment of apparatus of the invention.

The invention is described in detail below in the non-limiting context of a plate 1 formed by assembling together a silicon wafer in which ions have been implanted to create a plane of weakness, and a stiffener, e.g. also made of silicon, in the so-called "wafer bonding" technique, the silicon wafer and/or the stiffener being, for example, oxidized on the surface(s) of the bonding face(s). Typically, such a plate is 200 mm in diameter and 1500 μm thick, with the thickness generally being shared equally between the implanted silicon wafer and the stiffener. The plate has two main faces 3 and 3', and inside the plate, at the depth of implanting in the silicon wafer, it has a plane of weakness 6 which defines two wafers 2, 4 that are to be separated, and that are situated on either side of said plane (see FIGS. 4*a* and 4*b*).

With reference to FIG. 1, separator apparatus of the invention is in the form of a pistol or clamp type portable appliance 100 essentially comprising a main body 10 from which there project two branches constituting two gripping members 30 and 32, and a handle 30 provided with a trigger 40, a knob member 60 for adjusting spacing, and a release pushbutton 62, whose functions are described below. The clamp 100 is connected by two suction tubes 50 and 52 to a vacuum pump (not shown).

The handle 30 enables an operator to hold the clamp 100 in one hand. With the same hand, the operator can use the trigger 40 to control the movement of the gripping members 30 and 32, as described in detail below.

Each of the gripping members 30, 32 is designed to adhere to a respective face 3, 3' of the plate 1 by suction, with the vacuum pump establishing suction between each of said members 30, 32 and the corresponding face 3, 3', said suction being strong enough to exert forces enabling the two wafers to be separated, as described below.

The body of the clamp 10 which is secured to the handle 30 receives one of the two gripping members 30 in fixed manner. The other gripping member 32 is connected to the body 10 via a first link part 22, a single-piece part 14 constituting a deformable parallelogram, and a second link part 20.

The gripping member 30 is described in detail below with reference to FIGS. 2*a* to 2*c*, it being understood that the other member 32 is preferably designed in this case to be identical.

The gripping member 30 is a generally thin and plane element of generally U-shaped outline extending from the body of the clamp 10 and possessing a suction cavity 35 in an inside face, i.e. a face that faces towards the other member, with the outline of the cavity generally being oval and lying within the outline of the member 30. Preferably, this cavity is in the form of a channel that is closed at each-of its ends by a concave curved wall. The zone of the plane of the gripping member 30 that is to come into contact with one of the main surfaces of the plate 1, and that corresponds to the free surface of the channel, extends from a region situated locally at the edge of the plate 1 to a central region of the plate 1. When the plate 1 is engaged with the gripping member 30, it rests against the outline of the channel, thereby constituting a set of thrust points, which are rigidly secured to one another because of the rigidity of the gripping member 30.

A vacuum connection orifice 36 opens out into the suction cavity 35 in the vicinity of the end thereof which is closer to the body of the clamp 10 and it communicates with an evacuation duct 37 embedded in the gripping member 30 and having its opposite end opening out to the edge of the element 30 that is adjacent to the body 10. The duct 37 is connected to a hose 50 for connection to a source of vacuum (not shown in FIG. 1). A non-return valve (likewise not shown) is interposed on the vacuum path and is suitable for being actuated by the pushbutton so as to allow air to be admitted selectively into the cavity 35 (and also the corresponding cavity of the other member 32) for purposes explained below.

When the suction cavity 35 is put into suction, the plate tends to deform and to penetrate into the suction cavity 35 between the thrust points corresponding to the outline of the suction cavity 35. Since the plate 1 is generally rigid, this deformation can possibly propagate throughout the entire plate, giving it a small amount of curvature mainly of convex shape around an elongate cap corresponding to the zone closing the cavity 35. This macroscopic deformation of the plate 1 can be accompanied by stresses favoring separation of the wafers 2 and 4 in the plane of weakness.

Although the gripping member 30 is rigidly secured to the front end of the body of the clamp 10, the other gripping member 32 is displaceable since it is fixed via a support part 22 to the free end 19 of the part 14 that constitutes a deformable parallelogram, which is described below with reference to FIGS. 3*a* to 3*c*. At this point, it may be observed that the vacuum duct opening out into the suction cavity of the member 32 is connected to the hose 52 in such a manner as to allow said member 32 to move.

The part 14 has a generally rectangular outline having two mutually parallel longitudinal arms 16 which are interconnected by two end portions 17 and 19 of said part via four hinges 18 which are formed in this case by portions of said arms that are of reduced thickness. This part is thus a single piece, and it is made of a material that is selected to provide suitable elastic deformability at the hinges. The thin portions defining the hinges 18 are defined between pairs of substantially semicircular recesses situated facing each other in the side faces of the arms 16 close to the end portions 17 and 19 so as to define privileged hinge axes which, in FIG. 3*a*, extend vertically.

This defines a parallelogram whose two long sides are formed by the arms 16, 16, said parallelogram being deformable in a plane perpendicular to the planes of the gripping members 30 and 32, and parallel to the longitudinal axes of said members.

The leading end 19 of the part 14 is rigidly secured in the link part 22 which carries the moving gripping member 32, while the rear end of the part 14 is rigidly engaged in the link piece 20 which is itself rigidly fixed to the body of the clamp 10.

It will thus be understood that movement of the part 22, and thus of the moving gripping member 32, takes place by deforming the parallelogram in such a manner that the gripping members 30 and 32 are held parallel to each other as accurately as possible.

Thus, FIGS. 3*b* and 3*c* are diagrams showing the displacements of the portion 22, and of the gripping member 32, respectively in a spaced-apart position where the two gripping members 30 and 32 define between them a gap of width that is greater than the thickness of a plate to be separated, and in a close-together position where the two gripping members 30 and 32 define between them a gap of width that is narrower than the thickness of the plate.

It should be observed at this point that the part 14 also acts in the present example as resilient means, being made of a material that presents well-determined elasticity, such as a relatively rigid plastics material or a metal. The part is also designed so that its shape at rest is that which corresponds to FIG. 3*b*, and that a force for bringing it into the position shown in FIG. 3*c* gives rise to stress within the part acting as resilient return means tending to return it towards its FIG. 3*b* position.

The clamp is also provided with force transmission means (not shown) for transmitting to the link part 22 a pressure force exerted on the trigger 40 so as to displace the assembly shown in FIGS. 3*a* and 3*b* from the FIG. 3*b* position towards the FIG. 3*c* position.

By way of example, these means can comprise an appropriate linkage or a force transmission device based on a cam or a ramp.

The adjustment member 60, e.g. in the form of a knob having a threaded shank defining an end-of-stroke abutment, serves to define at will the amplitude of the movement that can be performed by the gripping member 32. More precisely, this abutment is designed to oppose the return movement from the position of FIG. 3*c* towards the position of FIG. 3*b* in adjustable manner so as to determine, in the absence of pressure on the trigger 40, the size of the gap between the gripping members 30 and 32 when they are in their spaced-apart position. This makes it possible, in particular, to adapt the tool appropriately to the gap between adjacent plates 1 received from a common rack and designed to be taken one after another for separation purposes, given that the size of the gap can vary depending on the type of rack.

The use and the behavior of the separation clamp as described above when separating a plate 1 into two wafers is described below in detail with reference to FIGS. 4*a*, 4*b*, and 5.

The vacuum pump is initially put into operation to apply a vacuum to the two ducts 50 and 52. Initially, while the clamp is in a rest position where no force is being applied to the trigger 40, i.e. in which the gripping members are in their spaced-apart position, the clamp is taken to a plate for separation that is contained in a support member such as a rack, in such a manner that said members 30 and 32 are to be found on opposite sides of the plate, and above all the cavities 35 in these two members are both in a position relative to the plate that is similar to the position shown in FIGS. 2*a* to 2*c*, i.e. in which the proximal ends of the cavities 35 are set back a short distance from the edge of the plate (typically a few millimeters to about one centimeter).

At this point, it should be observed that the support member can have fittings (abutments or the like) enabling the position of the members 30 and 32 relative to the plate to be indexed so as to ensure that the members 30 and 32 and the plate are mutually positioned in a manner that is reproducible.

It should also be observed that the shape of the clamp, with two thin and projecting gripping members is particularly well adapted to the situation where plates 1 for separation are to be found in succession in a rack.

The operator then applies pressure to the trigger 40 which tends to move the gripping members 30 and 32 towards each other until they come into contact with the two faces 3 and 3' of the plate. Since the cavities 35 are then exposed to a vacuum source, as mentioned above, a suction force is exerted on both of the faces as soon as the members 30 and 32 come into contact with them. Under such circumstances, the zones of the two faces 3 and 3' of the plate situated within the cavities 35 are exposed to the vacuum that has been established in the cavities 35, which vacuum exerts forces Fd on these zones serving firstly to hold the plate in the clamp and secondly tending to deform the plate locally in two opposite directions.

It should be observed at this point that the planeness of the inside faces of the two gripping members 30 and 32 around the cavities 35 is guaranteed to sufficient accuracy to ensure the appropriate degree of sealing at their interfaces with the respective faces 3 and 3' of the plate 1.

The plate, now firmly held by the clamp, can be extracted from its support.

The operator then releases pressure on the trigger 40 so that the resilient return force exerted by the part 14 tends to urge the two faces of the plate apart from each other with separation forces Fe in two opposite directions that are essentially perpendicular to the plane of the plate.

The above-specified deformation forces Fd and separation forces Fe combine as follows: firstly, as soon as the gripping members come into contact with the two faces of the plate, the deformation forces, because of the shape of the cavities, tend to form convex portions in each of the two wafers about the equivalent of an axis of rotation extending substantially along the major mid-axis of each cavity 35. This force, being exerted close to one of the edges of the plate, makes it possible to create a localized separation (region O) in the plane of weakness 6, thereby defining a gap I (of height that is exaggerated in FIGS. 4*a* and 4*b* for reasons of clarity) which is open to the adjacent edge of the plate, thereby making it possible to open this gap under good conditions. Thereafter, when the trigger 40 is released, the separation forces Fe exerted by the griping members give rise to a separation wave within the plate so as to propagate the separation from the localized separation O over the entire extent of the plane of weakness of the plate. This separation wave S, shown in FIG. 5, propagates from an origin zone O where separation was begun by the deformation forces.

During this propagation, the force exerted by the part 14 and tending to further separate the gripping members while keeping them parallel, also ensures that the two wafers of the plate come apart progressively without the facing faces of these wafers running any risk of coming back into contact with each other, thereby reliably avoiding any shock or friction that might otherwise damage the surface quality of said faces.

It should be observed at this point that the exact moment at which the separation wave propagates can vary. Thus, the wave can propagate, as described above, at the moment when the operator releases pressure on the trigger 40, or else (depending in particular on the size and the shape of the cavities) from the moment when the gripping members come into contact with the corresponding faces of the plate to exert deformation forces thereon, or else propagation can happen as a mixture of those two modes.

Other possible embodiments of the present invention are described below.

Thus, FIG. 6 shows a second embodiment of the invention comprising a fixed support 11 fitted in the present example with jaws 31 designed to hold the periphery of the plate 1 only over the height of the bottom wafer 2 of the plate 1, or over a fraction only of said height. The top wafer is secured to a gripping member 32 analogous to that fitted to the above-described clamp, itself fixed to the bottom end of a retractable arm 12 or the like, and which moves relative to the support 11 in a manner identical to the movements of the part 22 of the FIG. 1 clamp relative to the clamp body 10.

In a variant, the plate 1 can be held on the fixed support 11 by means of a wax, or indeed by using an electrostatic retaining device, in conventional manner.

This second embodiment is particularly suited to automating operations on a manufacturing line. A plurality of separator devices can thus be disposed side by side, and the arms 12 can be robotized. The feeding of plates to be separated, and the removal of wafers after separation can then be performed in automatic manner by suitable feed and removal means (cassettes, conventional plate-handling devices, etc.). In particular, the or each arm 12 is suitable for removing the wafer 4 which the gripping member 32 holds, after separation, and for taking it to a site for temporary or longer term storage or for processing.

On the same lines, the clamp described with reference to FIGS. 1 to 5 can form part of a robotized processing assembly, each gripping member being movable by being mounted on a robot arm, and serving to put down the wafer it holds after separation in an appropriate reception vessel. On this topic, it is possible to take hold of the plate that is to be separated by using only one of the gripping members, and to apply the other gripping member to the plate only subsequently.

Naturally, numerous variants can be made to the invention.

Firstly, the deformation forces can be applied to the plate with means other than suction, and in particular via a liquid received in a cavity that is closed by a membrane and within which suction is applied. Furthermore, where necessary, the forces can be accompanied by forces of adhesion associated with using an adhesive or a wax between the gripping members and the two faces of the plate.

In addition, the number and shape of the suction cavities 35, and indeed the shape of the gripping members 30 and 32 can vary widely. Thus, instead of creating a single separation start in the vicinity of an edge of the plate, it is possible to create two or more such separation starts that are spaced apart, still in the vicinity of said edge, or indeed to create a separation start that extends continuously over at least a portion of the periphery of the plate.

In all cases, it is preferable to generate a deformation stress gradient so that these stresses decrease from the edge of the plate 1 towards the more central zones thereof.

In addition, the movement of the moving gripping member can comprise pure translation, as described above, or indeed translation combined with rotation, providing, naturally, that separation takes place at each point on the plate with a speed that is not zero. It will be understood that the rotary component must take place about an axis that is situated away from the plate, preferably diametrically opposite from the zone O where separation starts, so that the greatest speeds of separation take place at that level and so that propagation of the separation wave is encouraged.

More generally, the distribution of stresses over the plates 1 depends on the shape and size of the wafers 2, 4 to be separated, on the nature of the bonds between the wafers 2, 4, and also on the location(s) at which it is desired to cause separation to start.

Also advantageously, the apparatus of the invention can be associated with various processing means for participating in separation or for encouraging it.

Firstly, the force exerted by the separator device can be combined with processing that contributes at least in part to cleavage in the plane of weakness, and in particular heat treatment or chemical treatment. Heat treatment can encourage the development of microcavities and of cleavage in the separation plane simultaneously with the separator apparatus is being implemented. The apparatus is then used by applying the gripping members 30, 32 to the plate 1 and releasing the stress on the member 32 so that the two members tend to move apart. So long as cohesion forces-remain high, the two members 30, 32 remain close together. As soon as the heat treatment has given rise to sufficient cleavage, the separation forces applied by the two member 30 and 32 can assist such cleavage and then immediately space apart the two separated wafers, thereby specifically avoiding the losses of time associated in a conventional process with the two wafers sticking back together again after they have been cleaved apart.

Thus, the cleaving and separating steps are advantageously combined so as to simplify the manufacturing process.

In the same manner, treatment by chemical attack in channels formed in the plane of weakness can be combined with separation in accordance with the invention so as to simplify the process in that case also.

In each case (heat treatment, e.g. by inserting the separation apparatus carrying the plate into an oven, or chemical treatment in a bath, or other treatment), the various elements of the separation apparatus are naturally designed to withstand the environment associated with the treatment in question (in particular temperature, typically several hundreds of degree Celsius, or the chemical agent).

Furthermore, such additional treatment can cause auxiliary stresses to be applied that favor separation. This can apply in particular to sound or ultrasonic vibration, to thermal shock, etc.

In yet another variant, heat can be applied to the plate 1 via at least one gripping element, and, if necessary, different quantities of heat can be supplied to the two different faces of the plate.

More generally, it is possible advantageously to make use of the two faces of the plate coming into contact with the gripping members to apply controlled temperature gradients to the plate, either going up or down. In particular, the above-mentioned thermal shock can be exerted by using gripping members that have previously been cooled to a temperature lower than that of the plate.

Another type of stress can also be generated by applying a flow of fluid (gas or liquid) at high speed to the edge of the plate where the separation start is to form, with the fluid being intended to penetrate into the separation gap as soon as it forms, and to favor propagation of the separation wave by means of the forces it exerts.

Also advantageously, the separation apparatus of the invention can include a sensor for sensing the end of separation between the wafers 2 and 4, e.g. by means of a contactor interposed on the path of the moving gripping member, so as to optimize throughput and avoid overexposing the separated wafers 2 and 4 to any means that might be in use for applying auxiliary stresses. This also makes it possible to avoid calibrating the length of time during which stresses are applied, and to act in optimum manner for each plate 1, given that separation times can vary in practice as a function of operating conditions or as a function of the batches being processed.

By way of example, the method and apparatus of the invention can be used in non-limiting manner to make silicon on insulator substrates. The invention applies to separating along planes of weakness obtained in any manner whatsoever, with or without heat treatment, and in all kinds of material, and in particular in semiconductor materials.

What is claimed is:

1. A method of separating into two wafers a plate of material for manufacturing substrates for electronics, optics, or optoelectronics, or for manufacturing microsystems, said wafers being situated on either side of a plane of weakness, the method comprising the steps of:

exerting a deformation force by applying suction to at least one of the wafers in a region extending from close to an edge of the plate to a center thereof in a zone situated between at least two thrust points that are rigidly secured to each other so as to deform said at least one wafer and thereby cause the wafers to separate from each other in a zone of the plate at said plane of weakness; and exerting guided separation movement on the wafers.

2. The method according to claim 1, wherein the region within which said suction is applied to exert the deformation force is a radially asymmetrical region relative to said plate.

3. The method according to claim 1, wherein said separation movement is obtained by moving means for applying said suction in a direction that extends generally transversely to the plane of the plate.

4. The method according to claim 1, wherein said separation movement is obtained by moving at least one of the wafers in translation without rotation.

5. The method according to claim 1, wherein said separation movement is obtained by moving at least one of the wafers in translation accompanied by rotation.

6. The method according to claim 1, further comprising the step of releasing at least one of the wafers by eliminating the suction.

7. The method according to claim 1, wherein said step of exerting a deformation force is implemented simultaneously with cleavage treatment on the plane of weakness and/or with a step of applying stress suitable for favoring separation.

8. The method according to claim 7, wherein said application of stress is taken from the group consisting of applying a temperature gradient, applying mechanical vibration, applying chemical etching, applying shear stress, and applying a flow of fluid at high speed.

9. An apparatus for separating a plate of material, in particular of semiconductor material, into first and second wafers, said wafers being situated on either side of a plane of weakness, the apparatus comprising:

means for holding said plate via said first wafer;

stress-applying means for exerting deformation stress on at least said second wafer by applying a suction force in a zone of the plate situated between at least two bearing points that are rigidly secured to each other, said zone extending from close to an edge of the plate to a center thereof, said deformation stress creating a localized separation between said wafers within a centralized portion of said zone at said plane of weakness; and means for moving the wafers apart from each other along a predetermined path, said localized separation propagating along said plane of weakness.

10. The apparatus according to claim 9, wherein said stress-applying means and said moving means are constituted by the same a first gripping member.

11. The apparatus according to claim 10, wherein said gripping member possesses suction means.

12. The apparatus according to claim 11, wherein the gripping member includes a generally planer element whose face directed towards said wafer possesses at least one suction cavity.

13. The apparatus according to claim 12, wherein a single suction cavity is provided that is generally elongate in shape and that is suitable for extending between an edge region of the plate and a central region of the plate, said single suction cavity being radially asymmetrical relative to said plate.

14. The apparatus according to claim 12, wherein the suction cavity deforms the plate to give the plate a convex shape around an elongate cap.

15. The apparatus according to claim 12, wherein the holding means includes a second gripping member extending substantially parallel to said first gripping member.

16. The apparatus according to claim 15, further comprising guide means on which the first gripping member is mounted.

17. The apparatus according to claim 15, further comprising means for resiliently urging the first gripping member away from the second gripping member.

18. The apparatus according to claim 17, further comprising manual actuator means for urging the first gripping member against said resilient urging means so as to move said first and second gripping members towards each other.

19. The apparatus according to claim 17, wherein said guide means and the resilient urging means are constituted by a common member.

20. The apparatus according to claim 19, wherein said common member is a single-piece link member constituting a deformable parallelogram.

21. The apparatus according to claim 12, further comprising means for selectively eliminating the suction.

22. A method of separating a plate of material for manufacturing substrates for electronic microsystems into two wafers, said wafers being situated on either side of a plane of weakness, the method comprising the steps of:

exerting a deformation force by applying suction to at least one of the wafers in a region extending from close to one edge of the plate to a center thereof, a perimeter of said region defined by a plurality of wafer-surface-contacting points that are rigidly secured to each other;

exerting guided separation movement on the wafers; and at least one of said deformation force and said separation movement creating a localized separation between said wafers within a central portion of said region and at said plane of weakness, said localized separation initiating, in response to said separation movement, a separation wave propagating over an entire extent of said plane of weakness to separate said wafers.

* * * * *